United States Patent
Yasser et al.

(10) Patent No.: US 11,908,886 B2
(45) Date of Patent: Feb. 20, 2024

(54) POWER CONVERTER EMBODIED IN A SEMICONDUCTOR SUBSTRATE MEMBER

(71) Applicant: Danmarks Tekniske Universitet, Kgs. Lyngby (DK)

(72) Inventors: A. A. Nour Yasser, Soborg (DK); Hoa Le Thanh, Virum (DK)

(73) Assignee: Danmarks Tekniske Universitet, Kgs. Lyngby (DK)

( * ) Notice: Subject to any disclaimer, the term of this patent is extended or adjusted under 35 U.S.C. 154(b) by 0 days.

(21) Appl. No.: 18/169,730

(22) Filed: Feb. 15, 2023

(65) Prior Publication Data

US 2023/0275120 A1    Aug. 31, 2023

Related U.S. Application Data

(63) Continuation of application No. 16/968,902, filed as application No. PCT/EP2019/053302 on Feb. 11, 2019, now Pat. No. 11,600,690.

(30) Foreign Application Priority Data

Feb. 11, 2018    (EP) .................................. 18000124

(51) Int. Cl.
  *H02M 3/15* (2006.01)
  *H01L 49/02* (2006.01)
  (Continued)

(52) U.S. Cl.
  CPC ............ *H01L 28/10* (2013.01); *H01F 17/062* (2013.01); *H01L 23/481* (2013.01); *H01L 23/5227* (2013.01); *H02M 3/156* (2013.01)

(58) Field of Classification Search
  CPC ... H01L 28/10; H01L 23/481; H01L 23/5227; H01F 17/062; H01F 17/02; H01F 17/04; H01F 27/255; H02M 3/156
  See application file for complete search history.

(56) References Cited

U.S. PATENT DOCUMENTS 8,571,509 B2 * 10/2013 Ajram .................... H04B 15/04
                                                         455/298
8,907,447 B2    12/2014 Wang et al.
(Continued)

FOREIGN PATENT DOCUMENTS

EP    2479890 A1    7/2012
IN    1355            3/2015
(Continued)

OTHER PUBLICATIONS

Application for Miniaturized, High Power Density Power Electronic System on a Chip; Application No. 1355/CHE/2015, Filing date Mar. 19, 2015.

(Continued)

*Primary Examiner* — S M Sohel Imtiaz
(74) *Attorney, Agent, or Firm* — DINSMORE & SHOHL LLP

(57) ABSTRACT

A power converter is embodied on a semiconductor substrate member and has a first region with a passive electrical component with a first electrically conductive layer pattern of an electrically conductive material and a second electrically conductive layer pattern of an electrically conductive material deposited on respective sides of the semiconductor substrate member. A trench or through-hole is formed (by etching) in the substrate within the first region, and the electrically conductive material is deposited at least on a bottom portion of the trench or on a sidewall of the through-hole and electrically connected to one or both of the first conductive layer pattern and the second conductive layer pattern. A second region has an active semiconductor component integrated with the semiconductor substrate by being fabricated by a semiconductor fabrication process. There is also provided a power supply, such as a DC-DC converter, embedded the semiconductor substrate member.

13 Claims, 9 Drawing Sheets

(51) Int. Cl.
*H01F 17/06* (2006.01)
*H01L 23/48* (2006.01)
*H01L 23/522* (2006.01)
*H02M 3/156* (2006.01)

(56) References Cited

U.S. PATENT DOCUMENTS

| | | | |
|---|---|---|---|
| 9,704,739 | B2 | 7/2017 | Chen et al. |
| 9,966,186 | B1* | 5/2018 | Peng .................... H01L 23/498 |
| 10,051,757 | B1* | 8/2018 | Pan ......................... H05K 7/14 |
| 10,141,057 | B1* | 11/2018 | Lin ........................ H10B 41/30 |
| 2001/0016976 | A1 | 8/2001 | Ahn et al. |
| 2003/0210101 | A1 | 11/2003 | McCorquodale et al. |
| 2005/0170554 | A1* | 8/2005 | Griglione .............. H01L 29/127 |
| | | | 257/E21.022 |
| 2007/0257761 | A1 | 11/2007 | Mano |
| 2011/0285302 | A1* | 11/2011 | Choutov .............. H05B 45/375 |
| | | | 315/207 |
| 2013/0187255 | A1* | 7/2013 | Wang .................... H01F 17/043 |
| | | | 438/381 |
| 2014/0266144 | A1 | 9/2014 | Khan et al. |
| 2015/0115403 | A1* | 4/2015 | Song .................. H01L 23/5227 |
| | | | 438/3 |
| 2015/0229295 | A1 | 8/2015 | Andry et al. |
| 2015/0303888 | A1* | 10/2015 | Yen ..................... H01L 23/5223 |
| | | | 333/175 |
| 2018/0090455 | A1* | 3/2018 | Brech ............... H01L 21/76898 |
| 2021/0287975 | A1* | 9/2021 | Raorane ............ H01L 23/49838 |

FOREIGN PATENT DOCUMENTS

| | | |
|---|---|---|
| KR | 20020014225 A | 2/2002 |
| KR | 20030052491 A | 6/2003 |
| KR | 100438892 B1 | 2/2004 |
| KR | 101044389 B1 | 6/2011 |
| WO | 2013137044 A1 | 9/2013 |
| WO | 2017108218 A1 | 6/2017 |

OTHER PUBLICATIONS

Le Thanh, H. et al.: "3D MEMS Air-core Inductor in a Very High Frequency Switched-Mode Power Converter" published 2017; Downloaded from orbit.dtu.dk on Sep. 11, 2020.

Le Thanh, H. et al.: "Fabrication of 3D air-core MEMS inductors for very-high-frequency power conversions", Microsystems & Nanoengineering, vol. 4, Jan. 2018, p. 17082.

* cited by examiner

POWER CONVERTER EMBODIED IN A SEMICONDUCTOR SUBSTRATE MEMBER

CROSS-REFERENCE TO RELATED APPLICATIONS

This application is a Continuation of U.S. application Ser. No. 16/968,902, filed Aug. 11, 2020, which claims priority to U.S. national stage Application PCT/EP2019/053302 filed Feb. 11, 2019, which claims priority to European Patent Application 18000124.0 filed Feb. 11, 2018 each of which is hereby incorporated by reference in its entirety.

FIELD OF THE INVENTION

The present invention relates generally to power converters.

BACKGROUND OF THE INVENTION

Semiconductor substrate components are widely used to closely integrate a few to millions of semiconductor components such as transistors, diodes, resistors, capacitors or even inductors to form much more complex circuits like central processing units, CPUs, microcontrollers and a wide range of other devices like modems for wired or wireless communication.

However, oftentimes it is necessary to electrically connect external passive components such as inductors and capacitors to the semiconductor components. In connection therewith, it is observed that there is an unmet demand for further closely integrating electrical circuits.

A special technical field, where there is such an unmet demand for closely integrating electrical circuits, is the field of power supply units, such as DC-to-DC converter units, which are typically based on switched-mode power conversion.

Typical requirements for a power supply unit, in general, are: low cost, light weight, high degree of reliability, efficient power conversation, and small size. Further typical requirements are modularity and being "easy to use".

With the earliest switched-mode power converters, it became clear that higher switching frequencies allow smaller inductors and capacitors. This in turn should lead to smaller, lighter, and less costly systems. Smaller inductors and capacitors generally contribute to higher power densities. Power density may be defined as electrical power per volume unit, such as [W/mm$^3$], which represents rated electrical power input to or output from a power converter divided by the cubic space of the power converter.

However, using a high switching frequency is not enough to achieve higher power densities. Also, a high switching frequency may come at the cost of decreased efficiency of the switched-mode power converter since parasitic components play an increasing role with increasing switching frequency. New devices need to be developed to achieve a goal such as higher power density.

In general, it should be appreciated that a semiconductor substrate member is a piece of substrate which may have embedded therein, by a semiconductor manufacturing process, one or more semiconductor components.

In contrast thereto, semiconductor substrate member may carry one or more components attached to the semiconductor substrate member e.g. by soldering or wire-bonding or another bonding technique. This is typically performed by (during) montage or mounting, such as surface mounting.

Also, it should be appreciated that a semiconductor substrate member may be attached to one or more other semiconductor substrate members e.g. in a stack. Further, a semiconductor substrate member may be attached to a printed circuit board, PCB; which may have one or more metal layers supported by layers of e.g. a glass-fibre reinforced epoxy material.

Generally, it is known that wire-bonding connections introduces parasitic inductances and resistances and behaves as antennas transmitting electromagnetic radiation which easily causes problems related to electromagnetic interference, EMI, especially at (high) switching frequencies.

Generally, stray electromagnetic fields are known to cause problematic Electromagnetic Interference, EMI. Especially, switched circuits, such as switched power supplies like DC-to-DC converters and switched power amplifiers like class-D power amplifiers, are prone to cause EMI problems.

Generally, it is known that so-called flip-chipping, which is a technique used for surface mounting semiconductor substrate members to e.g. printed circuit boards, has its limitations in terms of stacking components since a semiconductor substrate member for flip-chipping has only one side available for mounting.

Generally, in the field of power converters circuit architectures fully or partially implemented in a silicon substrate as a small-sized module, it is known that the term PSiP designates "Power Supply in a Package" and the term PwrSoC designates "Power Supply on a Chip".

RELATED PRIOR ART

U.S. Pat. No. 8,907,447 discloses an inductor integrated in a semiconductor substrate for use in a DC-DC converter. Such an inductor is sometimes referred to as a power inductor in silicon. In an embodiment, the inductor has a magnetic core of magnetic material embedded in a silicon substrate and a conductive winding. The inductor is a spiral inductor, or a toroidal inductor integrated in the substrate. A cap layer of magnetic material is disposed on at least one side of the silicon substrate to increase the inductance of the inductor. It is also described that the DC-DC converter includes an integrated circuit mounted on top of the cap layer of the power inductor in silicon. However, despite of having a small size, there is still a need for more integration and improved efficiency of such DC-DC converters. Also, The process used for manufacturing the inductors is not compatible with semiconductor processes which makes it harder to integrate active devices and other passive devices in the same substrate for tighter integration.

KR 10-0438892 discloses a one-chip module package by forming an integrated circuit and a thin film inductor in the same semiconductor substrate. A first and a second well region are formed in a semiconductor substrate. A first and a second MOS (Metal Oxide Semiconductor) transistor are formed on the first and second well region, respectively. A plurality of metal layer patterns are electrically connected between the first and second MOS transistor and impurity regions. A protecting isolation layer is located on the resultant structure for separating the metal layer patterns. A lower core layer pattern is formed on the predetermined portion of the protecting isolation layer. The first polyimide layer, a metal coil layer, the second polyimide layer, an upper core layer pattern, and the third polyimide layer are sequentially formed on the resultant structure.

Most of the prior art on integrated power supplies use either on-silicon inductors or in-silicon inductors fabricated by 2D semiconductor fabrication technologies. 2D semiconductor fabrication technologies are limited to planar inductor geometries, such as circular spirals, rectangular spirals, and elongated spirals (so-called racetrack inductors) —all of which induces strong stray electromagnetic fields perpendicular to the inductor plane. This is a problem towards closer integration of components since the stray electromagnetic fields, perpendicular to the inductor plane, interferes with other components, such as active semiconductor devices, integrated in proximity of the inductor, whereby electromagnetic interference (EMI) is likely to become an issue.

Thus, there is still a need for a small-size one-chip module package which enables tight integration and reduced stray electromagnetic fields.

SUMMARY OF THE INVENTION

It is realized that a fully functional power converter, such as a DC-to-DC converter can be embodied on a single semiconductor substrate member with a thickness of less than a millimetre including all active and passive components needed. There is provided:

A power converter embodied in a semiconductor substrate as set out below. In some embodiments the power converter is a DC-DC converter. In some embodiments the power converter is a power amplifier e.g. an audio power amplifier.

There is also provided a semiconductor substrate member, comprising:

a first region with a passive electrical component with a first electrically conductive layer pattern of an electrically conductive material and a second electrically conductive layer pattern of an electrically conductive material deposited on respective sides of the semiconductor substrate member; wherein a trench or a through-hole is formed in the substrate within the first region, and wherein the electrically conductive material is deposited at least on a bottom portion of the trench or on a sidewall of the through-hole and electrically connected to one or both of the first conductive layer pattern and the second conductive layer pattern; and a second region with an active semiconductor component embedded in the semiconductor substrate member by a semiconductor fabrication process.

Such a semiconductor substrate member enables the manufacture of thin power supplies which are suitable for products which require very tight integration of its components, such as in mobile devices e.g. smart-phones, smart-watches etc. Oftentimes, such products require a certain degree of Electromagnetic Compatibility, EMC, to ensure proper functioning of advanced circuitry inside the product.

Such a semiconductor substrate member enables better inductor topologies such toroidal inductors and solenoid inductors, compared to spiral inductors. This may be attributed to the geometry enabling an improved quality factor (related to storing of energy to losses ratio) of the inductor.

Such a semiconductor substrate member can be made much smaller that corresponding components on a Printed Circuit Board and with much smaller tolerances, which in turn reduces parasitic elements and hence enables use of higher switching frequencies e.g. in a power supply module such as DC-DC converter.

Especially, it is possible to reduce electromagnetic field radiation from the semiconductor substrate member. The passive components have a 3D, three-dimensional, configuration extending not only as electrical paths at the surface of the semiconductor substrate member in one or both of a horizontal top and bottom plane, but also with electrical paths through the semiconductor substrate member in a vertical direction. Thus, forming a 3D, three-dimensional, configuration. This enables to a higher degree, than for planar passive components, to keep electromagnetic fields, at least where they are strongest, inside the volume of the semiconductor substrate member.

The active semiconductor component embedded in the semiconductor substrate member may be fabricated e.g. by a Silicon, Gallium-nitride, or Gallium-arsenide semiconductor fabrication process. The semiconductor fabrication process may be a conventional semiconductor manufacturing process where a semiconductor wafer is used as a starting material for the manufacturing process. The process may involve etching, deposition of implants such as a so-called dopant like Boron and Phosphorus to form active devices like transistors and diodes, and deposition of metal one or more layers to form interconnects among the active components. The result of the process is a processed wafer with active components.

The processed wafer with active components is passivated by one or more protective layers to protect the active components from post processing steps.

Post processing steps are applied to form the passive components. Post processing steps may include etching to form trenches and through-holes and deposition to apply one or more metal layers to form the passive components. The one or more metal layers are formed e.g. at the through-holes to form through-substrate vias (TSVs) and/or at the one or more trenches and/or between the passive component and the one or more active components to form the electrically conductive layer pattern and/or at pads for soldering or wire-bonding to attach additional component members. One or more steps of post processing is to establish electrical connection between the passive components and the active components by deposition of a metal layer; this may include removing the protective layer fully or partially to enable electrical connection with the active components. The result of post processing is the semiconductor substrate member. The semiconductor substrate member may implement a power supply, a power amplifier or another integrated circuit comprising active and passive components.

Following post-processing, the semiconductor substrate member is manufactured and may be subject to assembly steps e.g. for being attached to a so-called lead-frame and/or a PCB and/or for having component members, such as SMD components attached to it by soldering. Also, component members may be attached by wire-bonding.

Manufacturing of a semiconductor substrate member with a structure as set out in the claims and generally described herein can be performed with a conventional semiconductor manufacturing process method and a method for manufacturing a hollow MEMS structure e.g. as described in WO 2017/108218-A1 assigned on its face to Danmarks Tekniske Universitet.

The thickness of the semiconductor substrate member may be e.g. about 280 um, 350 um, 500, 1100 um. The member may have a rectangular shape and be e.g. 6 by 9 mm or larger or smaller. The member may also have another shape e.g. circular or oval.

The first region and the second region may abut one another e.g. at a transverse or longitudinal border across the semiconductor substrate member. The first region and the second region may be spatially non-overlapping. The first region and the second region may have any shape and may have a mutually spatially complementary shape.

Depositing comprises one or more of electro-deposition, sputtering, evaporation, atomic layer deposition.

The semiconductor components may be in accordance with complementary metal-oxide-semiconductor (CMOS) technology. The power supply may be implemented as a so-called interposer, which may be arranged between an application printed circuit board (PCB) and an integrated circuit (IC). The interposer may establish conductive vias or paths between the PCB and the IC.

Further embodiments are described in the detailed description.

There is also provided a stack of components comprising one or more semiconductor substrate members as set out herein, wherein at least one semiconductor substrate member comprises pad portions on a top side and pad portions on a bottom side.

A stack of components may comprise: a first semiconductor substrate member and a second semiconductor substrate member. A stack of components may additionally comprise one or more of: a PCB, one or more further semiconductor substrate members, and more or more discrete components such as passive components and/or active components. The components may be surface-mount components. The components in the stack may be attached to each other at the pad portions by soldering or gluing.

There is also provided a DC-DC converter comprising a semiconductor substrate as described herein.

The DC-DC converter may have a configuration selected from the group of: Buck-converters, boost converters, and fly-back converters. The converters may be step-up or step-down converters. The converter may be a resonant converter. The DC-DC converter may be configured for voltages up to 10 volts or higher, e.g. 48 volts. The DC-DC converter may be configured to power levels of up to 20-30 Watts or higher.

BRIEF DESCRIPTION OF THE FIGURES

A more detailed description follows below with reference to the drawing, in which.

DETAILED DESCRIPTION OF THE PREFERRED EMBODIMENTS

Figure 1:
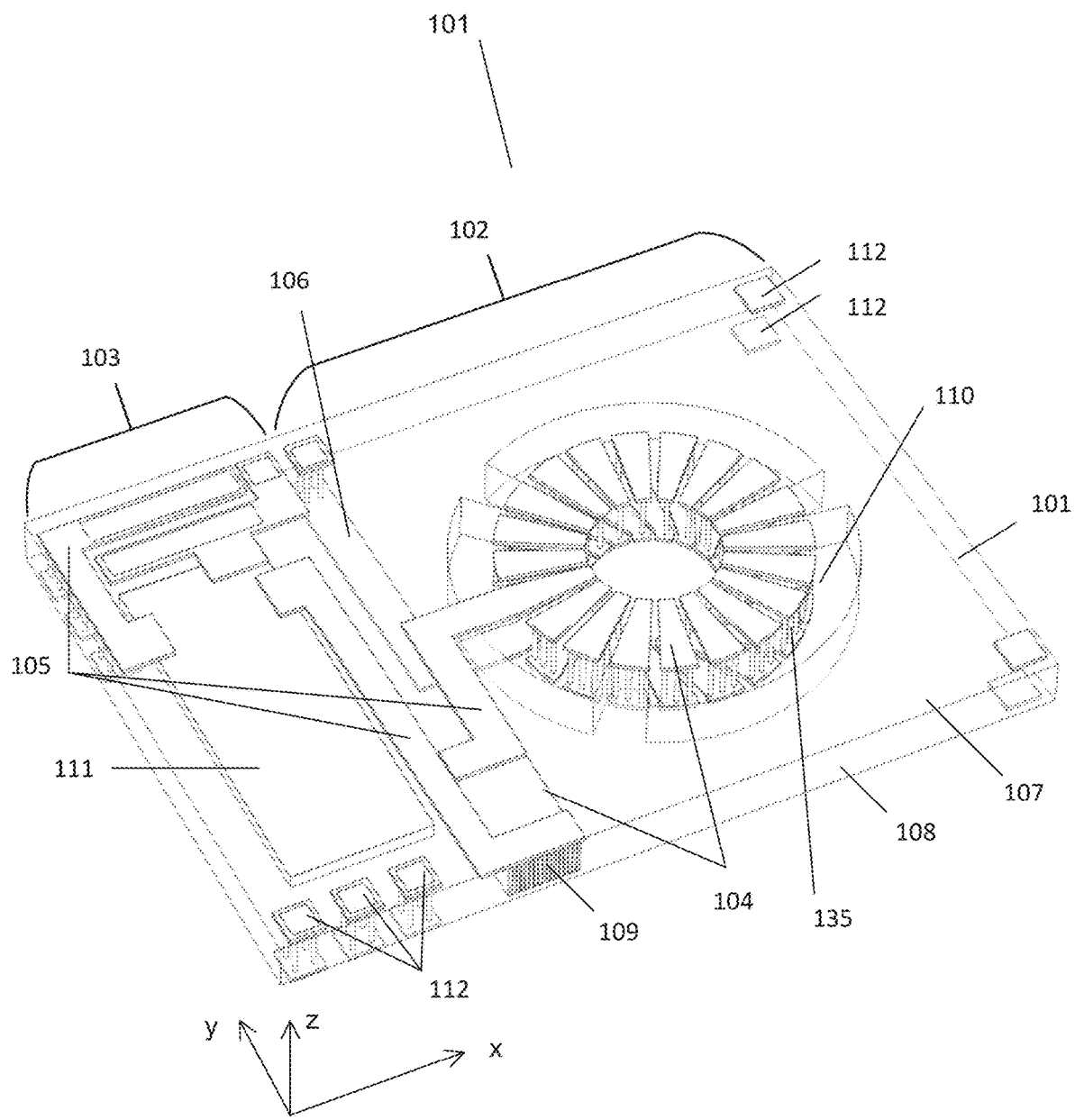
FIG. 1 shows a perspective view of a semiconductor substrate member with a first region with a passive electrical component and a second region with an active semiconductor component integrated with the semiconductor substrate member.

In some embodiments, the semiconductor substrate member is embodied as power supply in a package, PSiP, embodied as a micro-fabricated 3D passive interposer. The micro-fabricated 3D passive interposer may have a size less than about 40 by 40 by 1 mm, e.g. about 4 by 8 by 0.3 mm, and comprise 3D toroidal inductor with through-substrate vias, TSVs, and through-substrate vias establishing interconnects from one side of the micro-fabricated 3D passive interposer to the other. The power supply in a package may comprise a Buck converter or a Class DE resonant converter. The power supply in a package may comprise active components, such as one or more Field Effect Transistors, FETs, one or more gate drivers, and capacitors. The power supply in a package may operate in accordance with zero-voltage switching (ZVS), e.g. in accordance quasi-square wave (QSW) mode, to convert a first DC voltage, e.g. about 5 VD, to a second DC voltage e.g. about 3.3 VDC. The power supply in a package may operate at a switching frequency above 5 MHz e.g. at about 22 MHz. The power supply in a package may comprise a 3D air-core toroidal inductor e.g. of about 50-nH. However, the claims are not limited thereto. A Buck-type converter, power supply in a package, was successfully tested with an output current from 0 to 300 mA and an input voltage from 3.5 to 8.5 V. A peak efficiency of 83.0% at 300 mA output current was measured and a 1.15 Watts was delivered to a load.

In some embodiments one or both of the first electrically conductive layer pattern and the second electrically conductive layer pattern extends across at least some of second region to electrically connect the active semiconductor component with the passive electrical component.

In this way the path of the electrical connection between the active component and the passive component can be made shorter and less prone to generating electromagnetic interference, EMI. Also parasitic elements can be reduced.

Then interconnection between the active component and the passive component doesn't have to go via the PCB. This in turn reduces electromagnetic field radiation. Also, costs related to assembling may be reduced.

It should be noted that the one or both of the first electrically conductive layer pattern and the second electrically conductive layer pattern extends in parallel horizontal planes e.g. at opposite (top and bottom) sides of the semiconductor substrate member. However, one or both of the first electrically conductive layer pattern and the second electrically conductive layer pattern may follow topography, such as a submicron-topography of the semiconductor substrate member.

In some embodiments the one or both of the first electrically conductive layer pattern and the second electrically conductive layer pattern comprises a pad portion which is exposed for electrical connection by soldering, wire bonding or flip-chip bonding.

Thereby, the semiconductor substrate member is configured for use as an combined active-passive interposer. The pad portion enables interconnection with other components and/or a PCB by soldering or wire-bonding. In some embodiments the semiconductor substrate member comprises pad portions on both a top side and a bottom side which enables stacking of multiple semiconductor substrate members. Soldering may comprise using a solder paste or solder ball to electrically connect by heating to melt the solder.

Wire-bonding may comprise attaching a wire to the pad portion by applying sufficient pressure and/or heat e.g. by ultrasound. The wire for wire-bonding may comprise a metal such as gold, aluminium, or copper as it is known in the art.

Flip-chip bonding may comprise attaching a substrate to a PCB or another substrate by forming a ball or pillar of metal and gluing with an electrically conductive glue the ball or pillar to the substrate and the PCB or the other substrate.

In some embodiments one or both of the first electrically conductive layer pattern and the second electrically conductive layer pattern comprises a portion, extending from or to the pad portion, which is covered by an isolation layer. The isolation layer may be e.g. silicon oxide (SiO2), aluminium oxide (Al2O3), or silicon nitride (Si3N4). The isolation layer may be applied using methods known in the art.

In some embodiments the semiconductor substrate member comprises an inductor formed in the first region with an inductor winding of the inductor comprising:
 a first winding portion formed in the first electrically conductive layer pattern,
 a second winding portion formed by a first through-substrate-via,
 a third winding portion formed in the second electrically conductive layer pattern, and
 a fourth winding portion formed by a second through-substrate-via;
wherein the first, second, third and fourth portions are electrically connected by the deposited electrically conductive material.

Thereby a 3D inductor is formed. Such a 3D inductor may emit a significantly reduced electromagnetic field in a direction normal to the top and bottom surface of the semiconductor substrate member compared to a planar, e.g. spiral-shaped, inductor. Instead, the claimed inductor may have an electromagnetic field which is concentrated inside the volume of the semiconductor substrate member.

In some embodiments the inductor is a solenoid inductor or a toroidal inductor.

In some embodiments an inductor winding circumscribes an inductor core, comprising a material selected from the group of: air, silicon, magnetic materials, epoxy or a combination thereof.

In some embodiments an inductor winding circumscribes an inductor core, comprising magnetic particles suspended in epoxy. The epoxy material establishes spacing between the magnetic particles, thereby reducing eddy current loss. Thereby it is possible to strike a trade-off between an inductor with an air core known to have low loss, low inductance and a magnetic core known to have high loss, high inductance.

In some embodiments an inductor winding circumscribes an inductor core which has an array of deep trenches filled with or laminated with a magnetic material or magnetic particles suspended in epoxy. The array may comprise one or more rows of deep trenches. A core may comprise an array with e.g. 10 to 500 deep trenches.

In some embodiments an inductor winding circumscribes an inductor core which has an array of deep trenches laminated with a first layer of a magnetic material and a second layer of a non-magnetic material. Thereby, the non-magnetic layer reduces eddy current loss since magnetic layers are separated by the non-magnetic layer. Thereby it is possible to strike a trade-off between an inductor with an air core known to have low loss, low inductance and a magnetic core known to have high loss, high inductance. Thereby vertical laminar layers are established.

In some aspects, the semiconductor substrate member comprises a layer or patch of an electrically non-conductive material (dielectric) at least covering some openings of the deep trenches when the trenches are laminated. In some aspects the layers are deposited by electro-deposition or atomic layer deposition.

In some embodiments the inductor comprises a first coil and a second coil circumscribing a common inductor core, wherein windings of the first coil and windings of the second coil are formed by the first electrically conductive layer pattern and the second electrically conductive layer pattern and through-substrate vias. It should be noted that "windings" are windings of an inductor formed by depositing an electrically conductive material, rather than by winding a thread about the core.

A "through-substrate via" is a via formed by firstly etching a hole through the semiconductor substrate member and then depositing an electrically conductive material to establish electrical connection from one side of the semiconductor substrate member to the opposite side e.g. extending between pads at the opposite sides. The electrically conductive material should be electrically isolated from the substrate material.

In some embodiments the semiconductor substrate member comprises a capacitor formed by:
 a first capacitor member which comprises a conductive material deposited in first deep trenches extending from a first side of the semiconductor substrate; and
 a second capacitor member which comprises a conductive material deposited in second deep trenches extending from a second side of the semiconductor substrate.

The conductive material deposited in the deep trenches extending from the first side of the semiconductor substrate is electrically connected to the first electrically conductive layer pattern, and the conductive material deposited in the deep trenches extending from the second side of the semiconductor substrate is electrically connected to the second electrically conductive layer pattern.

Reverting to the Detailed Description:

FIG. 1 shows a perspective view of a semiconductor substrate member with a first region with a passive electrical component and a second region with an active semiconductor component integrated with the semiconductor substrate member. The semiconductor substrate member 101 has a substantially plate-shaped form. For convenience the size of the semiconductor substrate member 101 may be designated by a length along an x-axis, a width along a y-axis, and a height along a z-axis, as shown. Also, for convenience, the length and width are defined in a horizontal plane and the height in a vertical direction. Further, for convenience, a top side refers to one side 107 of the semiconductor substrate member (e.g. the one facing upwards in the figure) and a bottom side refers to the opposite side 108 of the semiconductor substrate member (e.g. the one facing downwards in the figure).

The semiconductor substrate member 101 has a first region 102 and a second region 103 which may be both defined in the horizontal plane. The regions may be associated with respective end-portions of the semiconductor substrate member or with another geometrical definition. The semiconductor substrate member may have a rectangular shape, a polygonal shape, a circular or oval shape or a combination thereof. Also, the first region 102 and the second region 103 may have a rectangular shape, a polygonal shape, a circular or oval shape or a combination thereof.

One or more passive electrical components 104, e.g. selected from the group of inductors, capacitors and resistors, may be accommodated within the first region 102.

One or more active semiconductor components 111 may be integrated within a second region 103 of the semiconductor substrate member 101 by being fabricated by a semiconductor fabrication process. The active semiconductor components may be selected from the group of transistors, diodes or any devices fabricated by a conventional semiconductor fabrication process. As it is known in the art, the semiconductor fabrication process may restrict transistors and diodes within the certain types e.g. CMOS types or bipolar types. It should be noted that the one or more active semiconductor components 111 are depicted as a rectangular 3D space, however, as it is known within the field of semiconductors, multiple semiconductor components—such as arrays of semiconductor components may be arranged and electrically interconnected in such a 3D space, irrespective of its shape.

One or more first electrically conductive layer patterns 105 of an electrically conductive material and one or more second electrically conductive layer patterns 106 of an electrically conductive material may be deposited on respective sides 107, 108 of the semiconductor substrate member 101. The one or more first electrically conductive layer patterns 105 and the one or more second electrically conductive layer patterns 106 serves to electrically connect one or more passive components within the first region with one or more active components within the second region. Additionally, or alternatively, the electrically conductive layer patterns 106, 107 form at least portions of the one or more passive components. The portions of the one or more passive components may be one or more of e.g. portions of inductor windings and portions of capacitor plates. In this respect the term 'windings' should be construed as being a winding of an inductor which is not "winded" as a thread, but rather a structure of an inductor. Further, the term 'capacitor plates' or simply 'plates' should be construed as serving the function of a capacitor plate, rather than necessarily having a plate-shape.

The semiconductor substrate member 101 has one or more, such as multiple, trenches 109 or through-holes 110 etched into, such as through, the semiconductor substrate member 101. The trenches 109 or through-holes 110 are formed by an etching process, removing semiconductor material from the semiconductor substrate member within the first region and/or within the second region. An isolation layer 113 may be deposited to electrically isolate the semiconductor material from the conductive material. The isolation layer 113 may be deposited during or after the conductive material is deposited. An electrically conductive material may be deposited at selected areas at least on the bottom portion, on a sidewall, or completely fill the through-hole to electrical connect to one or both of the first conductive layer pattern 105 and the second conductive layer pattern 106.

In some embodiments, the trenches 109 or though-holes 110 is passivated using an isolation layer 113 without deposition of a conductive layer. In some embodiments, the semiconductor substrate member is configured as a power converter e.g. a DC-DC converter and/or a power amplifier e.g. an audio power amplifier.

Subsequently, electrically conductive material is deposited at least on a bottom portion of a trench or on a sidewall of the through-hole to electrically connect to one or both of the first conductive layer pattern 105 and the second conductive layer pattern 106.

In this way, one or more passive components can be formed and electrically connected to the one or more active components.

It should be known that one or more pad portions 112 may be arranged on a bottom side and/or on a top side of the semiconductor substrate member to connect to the first electrically conductive layer pattern and/or second electrically conductive layer pattern and/or to provide for mechanical support e.g. by soldering to another member such as a PCB.

An isolation layer 113 is deposited to electrically isolate the one or more conductive layers from the semiconductor material.

In some embodiments the semiconductor substrate member 101 has a size of approximately 4-by-8 mm and thickness of about 280 μm. However, the semiconductor substrate member 101 may be larger or smaller than that e.g. up to 40-by 40 mm and with thickness of about 200 μm to 1100 μm.

Figure 2:
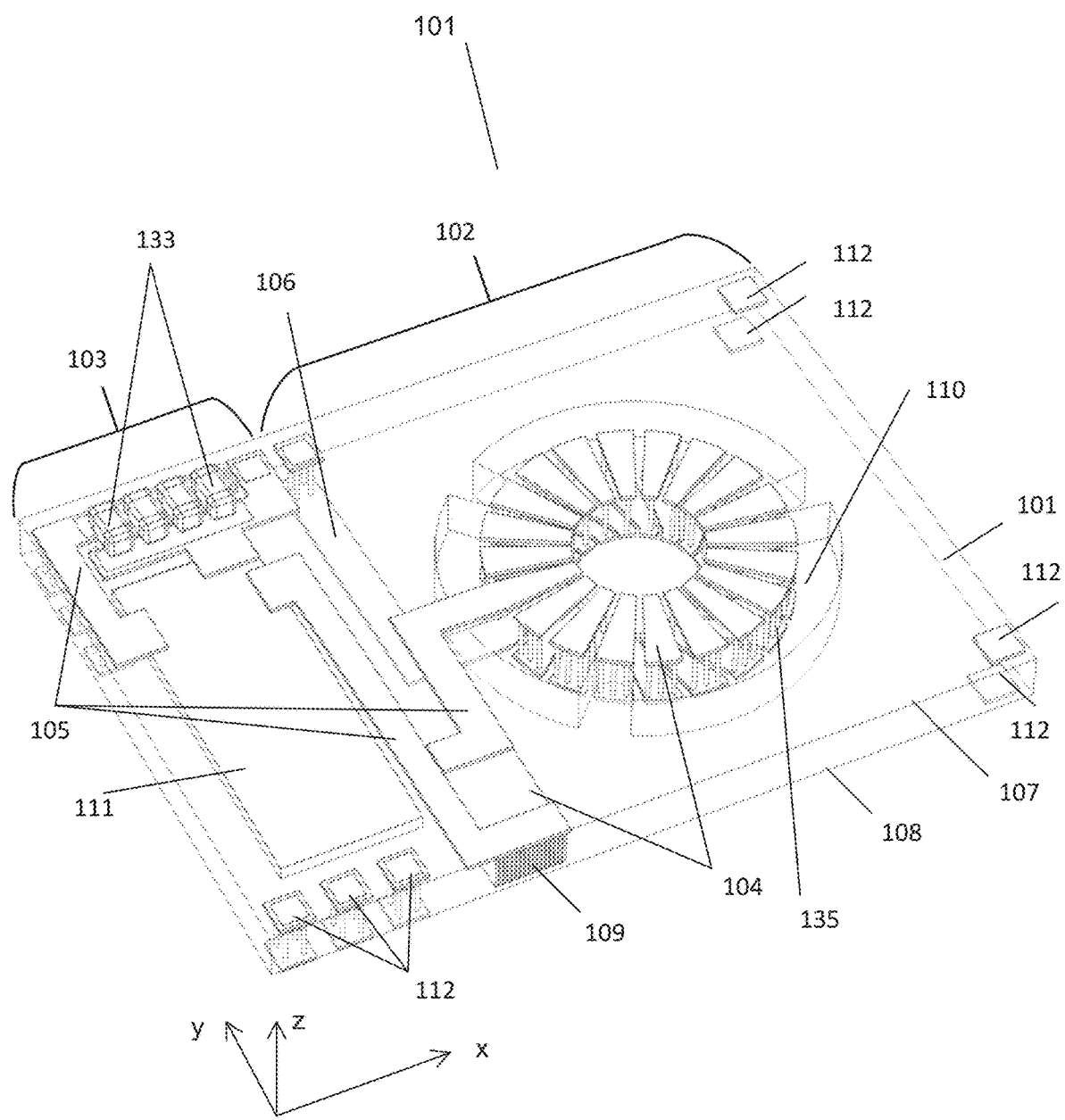
FIG. 2 shows a perspective view of the semiconductor substrate member of FIG. 1 with additional component members mounted on one side of the semiconductor substrate member.

FIG. 2 shows a perspective view of the semiconductor substrate member of FIG. 1 with additional component members mounted on one side of the semiconductor substrate member. Here, it is shown that the semiconductor substrate member 101 accommodates stacked, passive electrical components 133. The stacked, passive electrical components 133 may be attached to the semiconductor substrate member by surface-mount soldering. It should be noted however, that the semiconductor substrate member 101 may accommodate stacked, active electrical components.

It should be noted that the stacked, passive electrical components 133 or the stacked, active electrical components may be denoted discrete components in the sense that they are not integrated in the semiconductor substrate member.

It should be noted that the discrete components can be arranged anywhere on the semiconductor substrate member when attached at pad portions to connect to circuitry integrated with the semiconductor substrate member.

Figure 3:
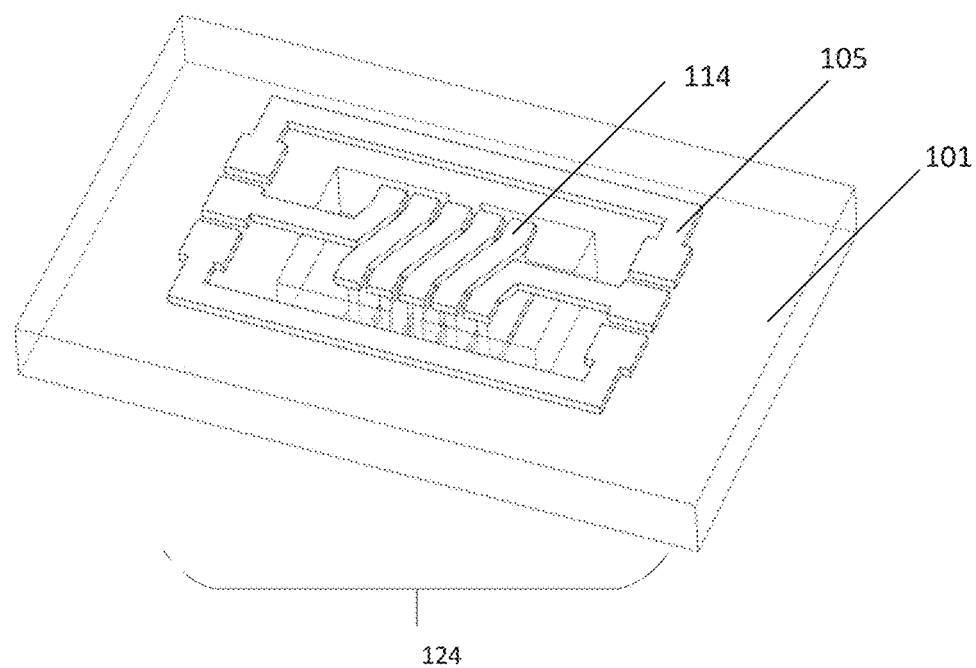
FIG. 3 shows a perspective view of a solenoid inductor embedded in the semiconductor substrate member.

FIG. 3 shows a perspective view of a solenoid inductor embedded in the semiconductor substrate member. The solenoid inductor 124 may be used as an alternative or in addition to the toroidal inductor. It should be noted that the semiconductor substrate member is shown only partially, not including the first region 102 which accommodates the one or more active semiconductor components.

The solenoid inductor 124 is electrically connected with one or both first electrically conductive layer pattern 105 and the second electrically conductive layer pattern 106 (not shown here). Thereby a 3D solenoid inductor is provided in the semiconductor substrate member 101.

Figure 4:
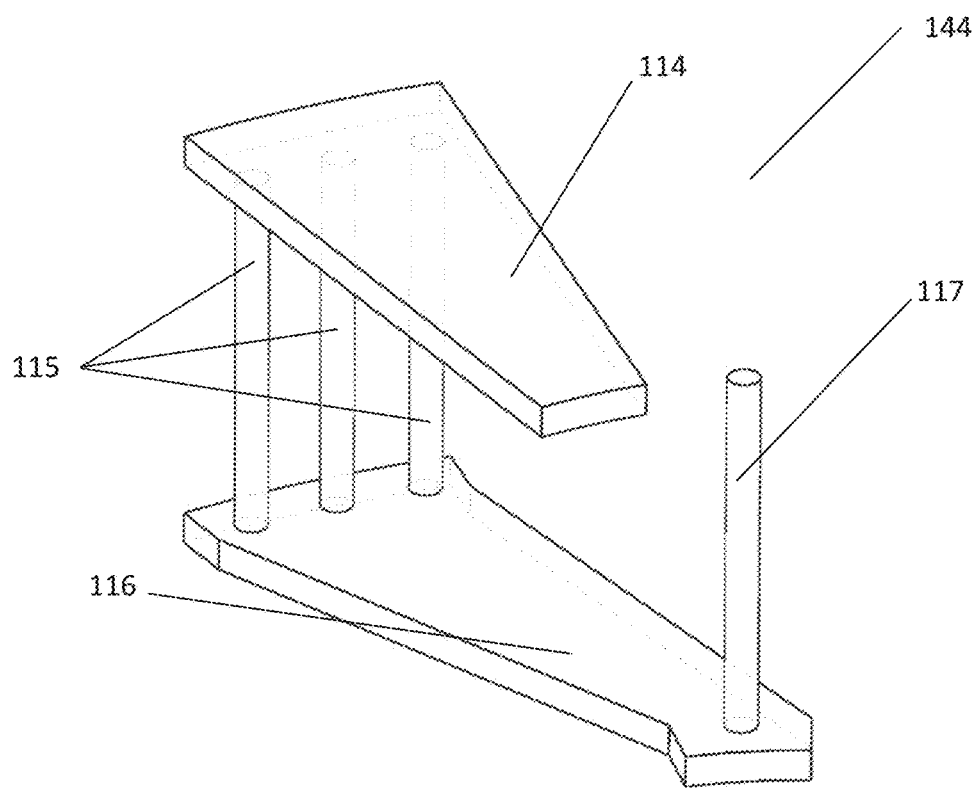
FIG. 4 shows a perspective view of a winding of an inductor embedded in the semiconductor substrate member.

FIG. 4 shows a perspective view of a winding of an inductor embedded in the semiconductor substrate member. The winding 144 may be a winding of a solenoid inductor or a toroidal inductor. Multiple windings 144 are arranged next to each other and are electrically connected to form an inductor as it is known in the art.

The winding 144 comprises a first winding portion 114 formed in the first electrically conductive layer pattern, a second winding portion 115 formed by a first through-substrate-via, a third winding portion 116 formed in the second electrically conductive layer pattern, and a fourth winding portion 117 formed by a second through-substrate-via. The first, second, third and fourth portions are electrically connected by the deposited electrically conductive material.

In particular, it should be noted that one or both of the second winding portion 115 and the fourth winding portion 117 may comprise one or more first through substrate vias, TSVs. The through substrate vias may have e.g. a substantially circular cross-section or have a substantially rectangular cross-section. The latter example can be described as a "vertical wall" rather than cylinders as shown.

Figure 5:
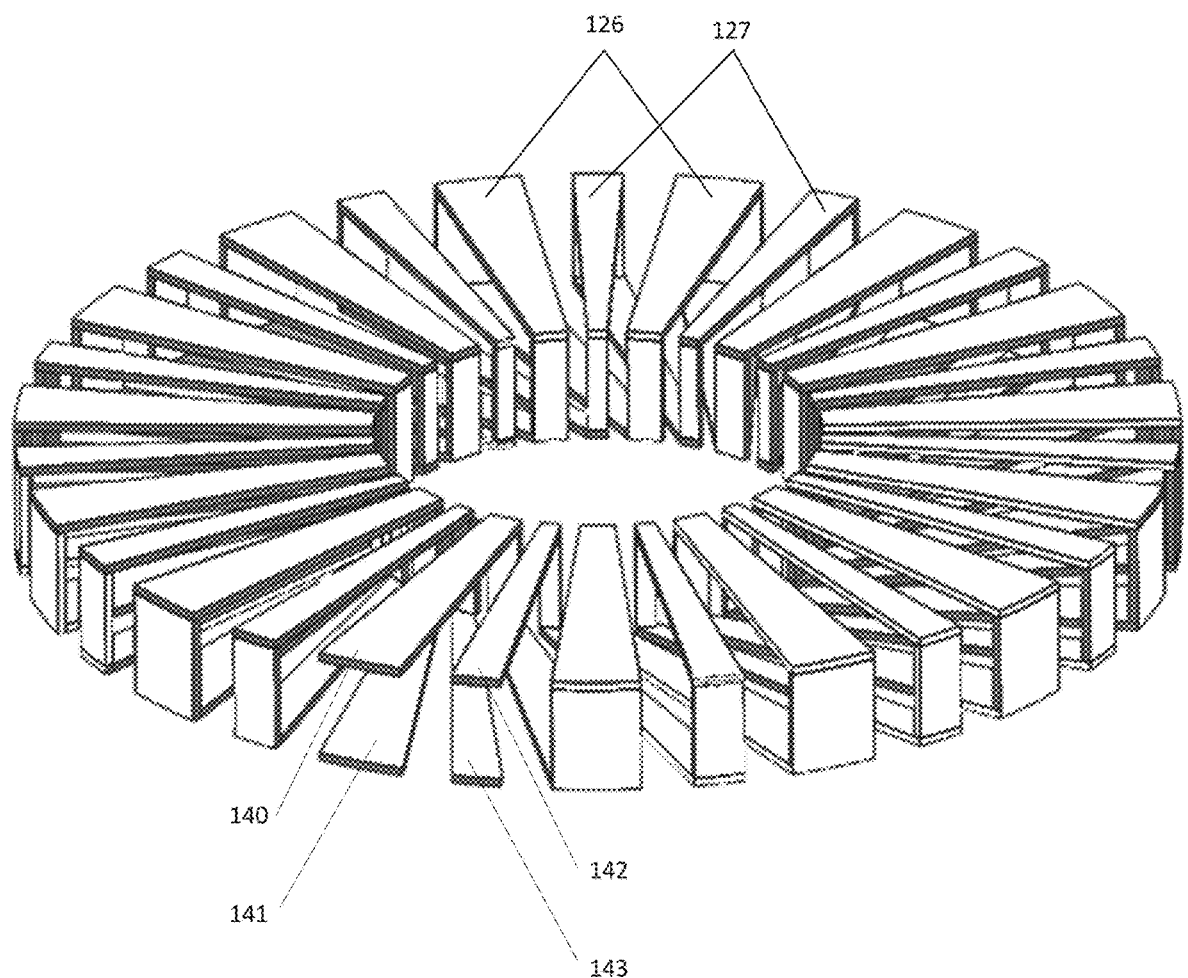
FIG. 5 shows a perspective view of a first coil and a second coil of an inductive transformer or a coupled inductor with coupled coils which can be embedded in the semiconductor substrate member.

FIG. 5 shows a perspective view of a first coil and a second coil of an inductive transformer with coupled coils which can be embedded in the semiconductor substrate member. The inductive transformer is configured as a toroidal inductive transformer and comprises a first coil 126 and a second coil 127 circumscribing a common inductor core. The first coil 126 is shown with relatively "wider" windings than the second coil 127, which has relatively "narrower" windings than the first coil 126. The first coil 126 and the second coil 127 are electrically isolated from each other. The windings "cross" each other at respective sides of the semiconductor substrate member, but not at the same side. Thus, with reference to the winding 144, for the first coil 126, a first winding portion 114 formed in the first electrically conductive layer pattern, "crosses" a respective third winding portion 116 of the second coil 127. One or both of the width and thickness of a winding of a respective coil, may be configured to carry a respective desired amount of electrical current.

Figure 6:
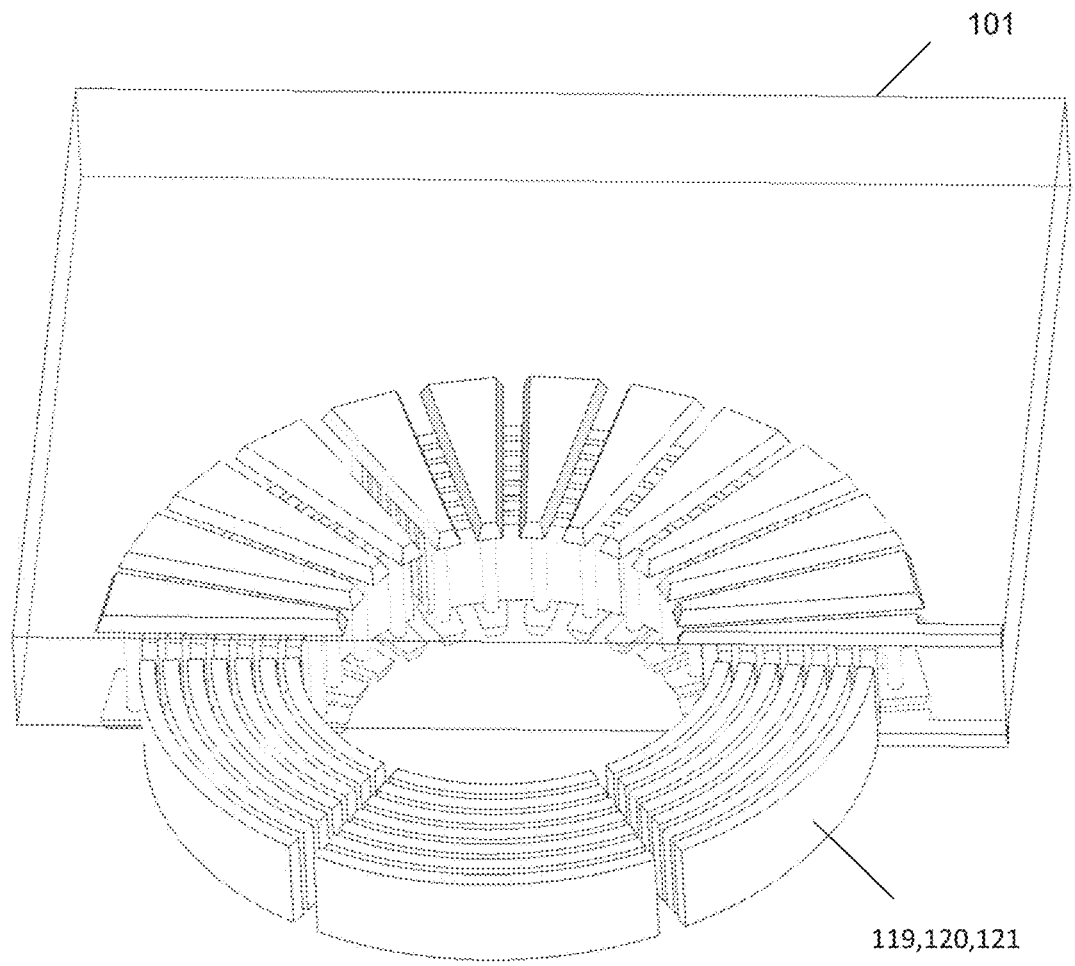
FIG. 6 shows a perspective view of the toroidal inductor embedded in the semiconductor substrate member and having a inductor core which has an array of deep trenches.

FIG. 6 shows a perspective view of the toroidal inductor embedded in the semiconductor substrate member and having an inductor core which has an array of deep trenches. For illustration purposes the semiconductor substrate member is partially cut away to better show the inductor core, which has an array of deep trenches 119.

As shown the deep trenches 119 are arranged as concentric, curved "vertical walls" to collectively substantially fit the space available within the core of the toroidal inductor or transformer as the case may be. The curved "vertical walls" are spaced apart in a direction normal to the wall. The walls may be divided into angular sections.

Figure 7:
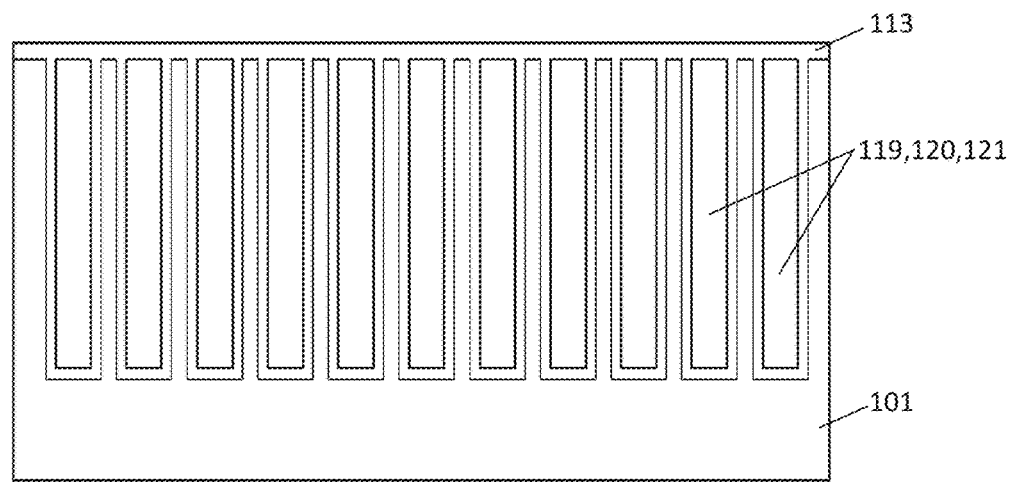
FIG. 7 shows a cross-sectional view of the inductor core which has an array of deep trenches.

FIG. 7 shows a cross-sectional view of the inductor core which has an array of deep trenches. The cross-sectional view is also a cross-section of a portion of the semiconductor substrate member 101. The uppermost portion shown is an isolation layer 113, which isolates an electrically conductive material deposited in the deep trenches 119 in the inductor core from one or more first electrically conductive layer patterns (not shown here) and from the semiconductor substrate 101.

Figure 8:
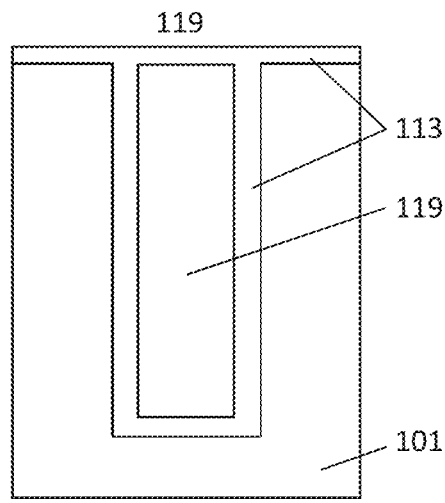
FIG. 8 shows a cross-sectional view of a trench, of an inductor core, filled with a magnetic material.

FIG. 8 shows a cross-sectional view of a trench, of an inductor core, filled with a magnetic material. The magnetic material is deposited in a deep trench laminated with an isolation layer 113 which isolates an electrically conductive material deposited in the deep trenches 119 in the inductor core from one or more first electrically conductive layer patterns (not shown here) and from the semiconductor substrate 101.

Figure 9:
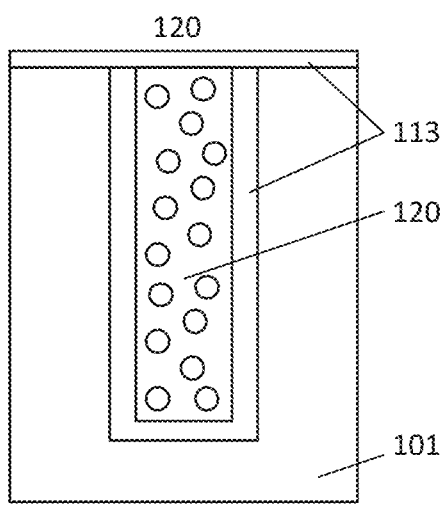
FIG. 9 shows a cross-sectional view of a trench, in an inductor core, filled with a magnetic material or magnetic particles suspended in epoxy.

FIG. 9 shows a cross-sectional view of a trench, in an inductor core, filled with a magnetic material or magnetic particles suspended in an epoxy material. The magnetic material or magnetic particles suspended in an epoxy material is designated by reference numeral 120.

Figure 10:
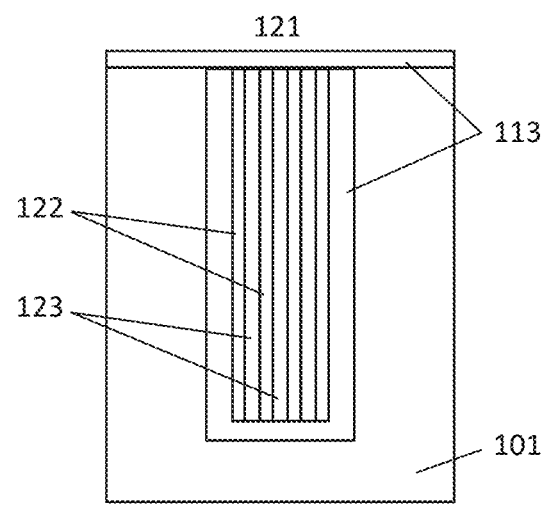
FIG. 10 shows a cross-sectional view of a trench, in an inductor core, laminated with a first layer of a magnetic material and a second layer of a non-magnetic material.

FIG. 10 shows a cross-sectional view of a trench, in an inductor core, laminated with a first layer of a magnetic material and a second layer of a non-magnetic material. The first layer 122 of a magnetic material is arranged alternately with a second layer 123 of a non-magnetic material. The layers may continue substantially horizontally at the bottom of the trench to connect vertical layers at the side or sides of the trench—alternatively, the vertical layers may terminate at the bottom of the trench with end portions of the vertical layers abutting a bottom portion of the trench.

Figure 11:
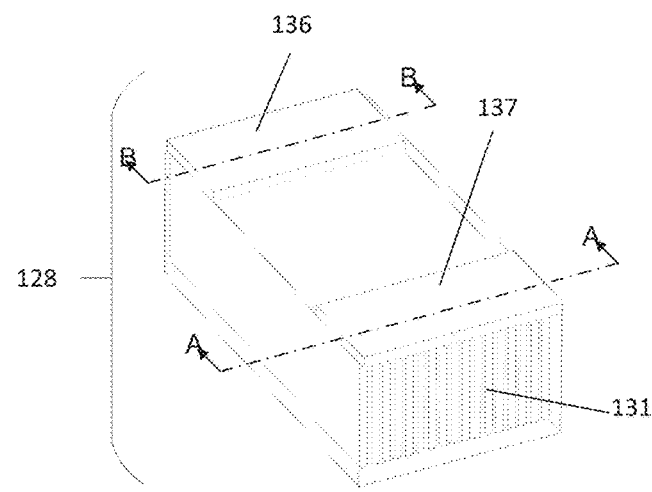
FIG. 11 shows a perspective view of the capacitor embedded in the semiconductor substrate member and cross-sectional views, A-A and B-B thereof.
Figure 11:
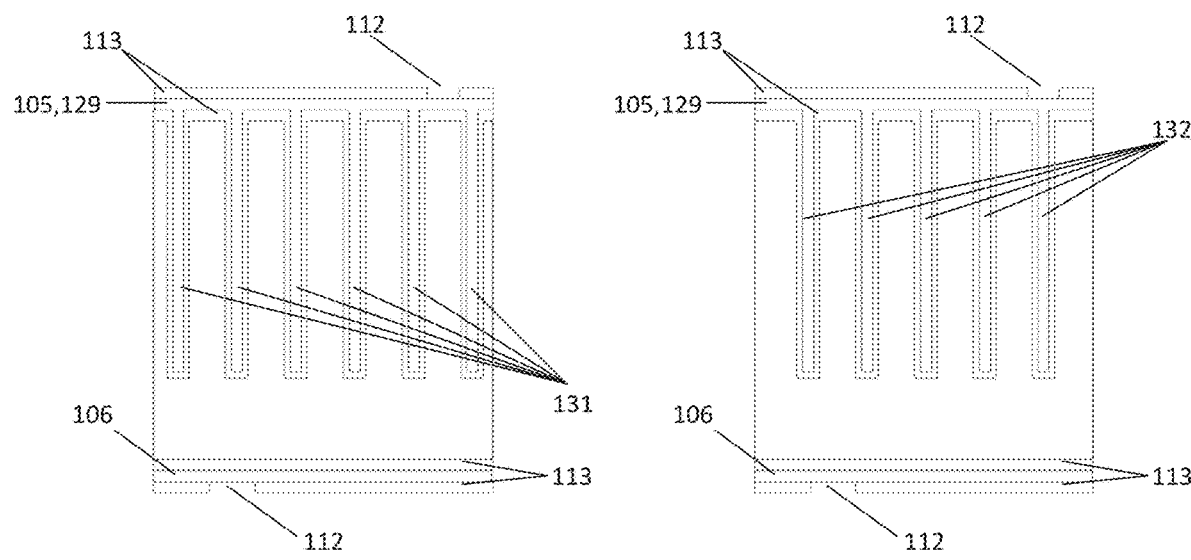

FIG. 11 shows a perspective view of the capacitor embedded in the semiconductor substrate member and cross-sectional views, A-A and B-B thereof. The capacitor has a first terminal 136 and a second terminal 137. The first terminal 136 and the second terminal 137 faces the same side of the semiconductor substrate member 101, but could also face opposing sides.

The "capacitor plates" are implemented as deep trenches wherein an electrical conductive material is deposited to form an array of parallel "vertical walls" or "lamella" alternately electrically connected to the first terminal 136 and the second terminal 137 and alternately electrically isolated from the first terminal 136 and the second terminal 137. Otherwise, the parallel "vertical walls" are electrically isolated from each other.

Cross-sectional view, A-A, shows that the first electrically conductive layer pattern 105, of which a portion may form a portion of the first capacitor member 129, is arranged between isolation layers 113. One or more of the isolation layers may extend along sides and bottom of the deep trenches and across the semiconductor substrate member between the deep trenches e.g. to form a substantially coherent layer. The first electrically conductive layer pattern 105, of which a portion may form a portion of the first capacitor member 129, may be deposited to form capacitor plates and to mutually connect the capacitor plates. Atop the first electrically conductive layer pattern 105, another one or more of the isolation layers may be deposited. One or more portions of the isolation layers may be removed e.g. by etching to expose electrical connection to the first electrically conductive layer pattern 105 e.g. as shown at pad portion 112 at the top-side.

Correspondingly, at the bottom side, the second electrically conductive layer pattern 106, one or more portions of the isolation layers may be removed e.g. by etching to expose electrical connection to the second electrically conductive layer pattern 106 e.g. as shown at pad portion 112 at the bottom side.

Cross-sectional view, B-B, shows essentially the same structure as shown in cross-sectional view, A-A. It can be inferred that the capacitor plates connected to respective capacitor terminals do not fully overlap, but rather are displaced relative to each other longitudinally. However, various configurations of the capacitor plates are foreseeable, e.g. comprising that the capacitor plates fully overlap in a longitudinal direction.

The isolation layers 113 also provides electrical isolation between the capacitor plates and the semiconductor substrate.

Figure 12:
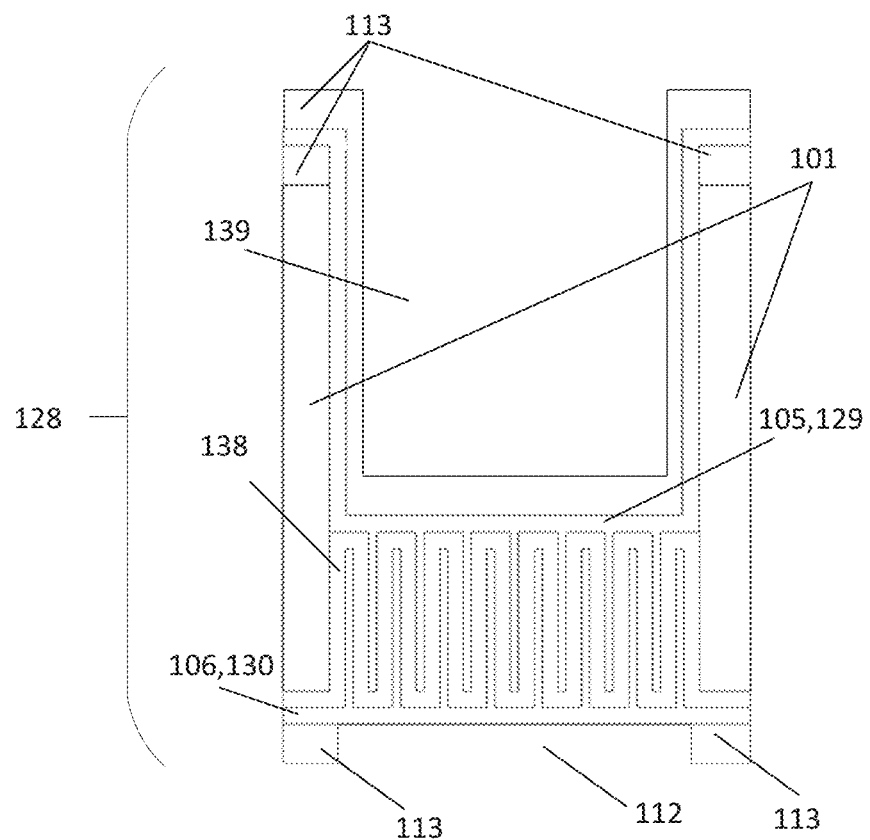
FIG. 12 shows a cross-sectional view of another capacitor, which can be embedded in the semiconductor substrate member.

FIG. 12 shows a cross-sectional view of another capacitor, which can be embedded in the semiconductor substrate member. This configuration of a capacitor is suitable for implementing capacitors with relatively narrow trenches, which may be difficult to reliably made deep in the sense that they extend through the full depth (thickness) of the semiconductor substrate. An unfilled trench 139 may reduce the thickness of the substrate at the area where the capacitor is embedded.

As shown, the wide and unfilled trench 139 is formed in the substrate from the top-side of the semiconductor substrate member. Inside the trench is deposited a portion of the first capacitor member 129 as a layer of conductive material, which electrically is connected to the first electrically conductive layer pattern 105.

The capacitor is formed by realizing non-overlapping deep trenches from both top and bottom side of the substrate. Isolating layer 113 is applied on the top side bottom side and inside the trenches. Conductive layer from top 105 is deposited to for the first plate of the capacitor 131. The second plate of the capacitor 132 is realized by depositing a conductive layer 106 on the back side of the substrate. Another Isolation layer 113 may be deposited on top and bottom of the substrate. Pads or pad openings 112 may be realized by etching the isolation layer for external connections.

The deep trenches are laminated with an isolation layer 138 to isolate capacitor plates of different polarity from each other and serves as the dielectric material of the capacitor. The isolation layer 138 may be made from a material that has a different dielectric constant than the material of the isolation layer 113. The material of the isolation layer 138 may have a dielectric constant larger than e.g. 12 and to about 150 or up to about 200 or higher. The material of the isolation layer 138 may be a ceramic e.g. titanium-oxide, which has may have a dielectric constant in the range of 86 to 173. The material of the isolation layer 113 may be for example silicon-oxide or Aluminium-oxide.

Figure 13:
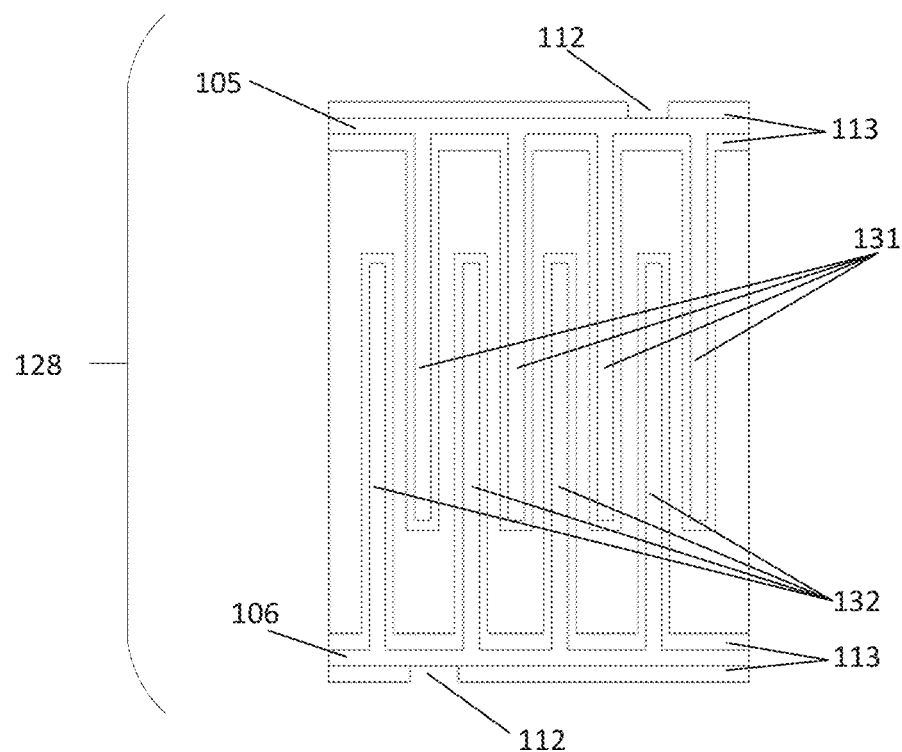
FIG. 13 shows cross-sectional view of yet another capacitor, which can be embedded in the semiconductor substrate member.

FIG. 13 shows cross-sectional view of yet another capacitor, which can be embedded in the semiconductor substrate member. The capacitor is formed by realizing non-overlapping deep trenches from both top and bottom side of the substrate. Isolating layer 113 is applied on the top side bottom side and inside the trenches. Conductive layer from top 105 is deposited to for the first plate of the capacitor 131. The second plate of the capacitor 132 is realized by depositing a conductive layer 106 on the back side of the substrate. Another Isolation layer 113 may be deposited on top and bottom of the substrate. Pads or pad openings 112 may be realized by etching the isolation layer for external connections.

A prototype of the device integrates two 40 V gallium-nitride field effect transistors (GaNFETs) driven by a high frequency half bridge gate driver and an in-silicon inductor in addition to input and output capacitors. The in-silicon inductor could be fabricated with a nonmagnetic-core (e.g. air core, non-conducting thermal conducting polymers) or integrated magnetic core (e.g. composite core by screen-printing, electroplated solid/laminated core). All the mounted components are commercially available. The prototype device is configured as a zero-voltage switching buck converter power stage.

The proposed converter uses a CMOS compatible process to construct 3D passive components without affecting the active part of the silicon die. As an added value, the top side of the silicon die can be used to integrate the components which are not compatible with integrated circuits processing like Gallium nitride FETs, Ceramic capacitors, etc. The mounted components are connected to the silicon devices using through silicon vias (TSVs) and/or conductive layers. The toroidal core can be fabricated with a wide range of core materials: air, silicon, non-conducting thermal polymers, composite core (micro or nanoscale magnetic powders mixed in a non-conducting thermal polymer), micro-fabricated magnetic material (magnetic thin films, lamination thin films, deep-trench magnetic).

The proposed converter allows the lowest profile converters (basically silicon wafer thickness if no stacked components are used). Lower noise converters are possible with technology due to shorter current loops and compact size.

The invention claimed is:

1. A power converter comprising a semiconductor substrate member comprising: a first region with at least one passive electrical component with a first electrically conductive layer pattern of a first electrically conductive material and a second electrically conductive layer pattern of a second electrically conductive material,
   wherein the second electrically conductive material is the same material as the first electrically conductive material or a different electrically conductive material,
   wherein a trench or through-hole is formed in the semiconductor substrate member within the first region, and
   wherein the first electrically conductive material is deposited at least on a bottom portion of the trench or on a sidewall of the through-hole and electrically connected to one or both of the first conductive layer pattern and the second conductive layer pattern;
   a second region with at least one active semiconductor component, said at least one active semiconductor component comprising a control part of a DC-DC power converter, embedded and fully integrated in the semiconductor substrate member by a semiconductor fabrication process,
   wherein the semiconductor fabrication process is a silicon fabrication process;
   wherein the at least one passive electrical component is adapted and electrically connected to the active semiconductor component to provide power converter functionality;
   wherein the power converter is embedded in a single semiconductor substrate piece by a semiconductor manufacturing process; and
   wherein the first electrically conductive layer pattern of the first electrically conductive material and the second electrically conductive layer pattern of the second electrically conductive material are deposited on respective sides of the semiconductor substrate member, which are at a respective top side and bottom side of the semiconductor substrate member,
   wherein the first electrically conductive layer pattern and the second electrically conductive layer pattern extend in parallel horizontal planes at the top side and bottom side of the semiconductor substrate member, respectively, between the first region and the second region to connect the at least one passive electrical component with the at least one active semiconductor component.

2. The power converter according to claim 1, wherein one or both of the first electrically conductive layer pattern and the second electrically conductive layer pattern comprises at least one pad portion which is exposed for electrical connection by soldering, wire bonding or flip-chip bonding.

3. The power converter according to claim 2, wherein one or both of the first electrically conductive layer pattern and the second electrically conductive layer pattern comprises a portion, extending from or to the at least one pad portion, which is covered by an isolation layer.

4. The power converter according to claim 1, further comprising one or more discrete components, the discrete components comprising being surface mounted additional passive components and/or active components.

5. The power converter according to claim 4, wherein:
one or both of the first electrically conductive layer pattern and the second electrically conductive layer pattern comprises at least one pad portion which is exposed for electrical connection by soldering, wire bonding or flip-chip bonding; and
the one or more discrete components are connected to the at least one pad portion.

6. The power converter according to claim 5, wherein the one or more discrete components are connected to the at least one pad portion by surface-mount soldering.

7. The power converter according to claim 1, wherein the at least one active semiconductor component comprises a capacitor embedded in the semiconductor substrate member by a semiconductor fabrication process.

8. The power converter according to claim 1, wherein the at least one active semiconductor component comprises one or more field effect transistors and/or one or more gate drives and/or one or more diodes.

9. The power converter according to claim 1, wherein the at least one active semiconductor component comprises an array of semiconductor components.

10. The power converter according to claim 1, wherein the power converter comprises a DC-DC converter.

11. The power converter according to claim 1, wherein the power converter comprises a power amplifier.

12. A stack of semiconductor substrate members comprising at least a first semiconductor substrate member and a second semiconductor substrate member, each comprising;
a first region with at least one passive electrical component with a first electrically conductive layer pattern of a first electrically conductive material and a second electrically conductive layer pattern of a second electrically conductive material, wherein a trench or through-hole is formed in the semiconductor substrate member within the first region, and wherein the first electrically conductive material is deposited at least on a bottom portion of the trench or on a sidewall of the through-hole and electrically connected to one or both of the first conductive layer pattern and the second conductive layer pattern;
a second region with at least one active semiconductor component, said at least one active semiconductor component being a control part of a DC-DC power converter, embedded and fully integrated in the semiconductor substrate member by a semiconductor fabrication process, wherein the semiconductor fabrication process is a silicon fabrication process,
wherein the at least one passive electrical component is adapted and electrically connected to the active semiconductor component to provide power converter functionality,
wherein the power converter is embedded in a single semiconductor substrate piece by a semiconductor manufacturing process,
wherein the first electrically conductive layer pattern of the first electrically conductive material and the second electrically conductive layer pattern of the second electrically conductive material are deposited on respective sides of the semiconductor substrate member, which are at a respective top side and bottom side of the semiconductor substrate member, and wherein the first electrically conductive layer pattern and the second electrically conductive layer pattern extend in parallel horizontal planes at the top side and bottom side of the semiconductor substrate member, respectively, between the first region and the second region to connect the at least one passive electrical component with the at least one active semiconductor component.

13. The stack of semiconductor substrate members according to claim 12, wherein the semiconductor substrate members comprise pad portions on top side and bottom side for connecting the semiconductor substrate members to each other.

\* \* \* \* \*